United States Patent
Chun et al.

(10) Patent No.: US 12,217,797 B2
(45) Date of Patent: Feb. 4, 2025

(54) STORAGE DEVICE AND OPERATING METHOD THEREOF

(71) Applicant: SAMSUNG ELECTRONICS CO., LTD., Suwon-si (KR)

(72) Inventors: Hojin Chun, Seoul (KR); Jiwon Park, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 230 days.

(21) Appl. No.: 17/806,333

(22) Filed: Jun. 10, 2022

(65) Prior Publication Data

US 2023/0138032 A1    May 4, 2023

(30) Foreign Application Priority Data

Nov. 3, 2021   (KR) ..................... 10-2021-0149698

(51) Int. Cl.
*G11C 14/00* (2006.01)

(52) U.S. Cl.
CPC ............................ *G11C 14/0018* (2013.01)

(58) Field of Classification Search
CPC ....... G11C 5/143; G11C 5/147; G11C 7/1006; G11C 7/1045; G11C 14/0018; G11C 16/0483; Y02D 10/00
See application file for complete search history.

(56) References Cited

U.S. PATENT DOCUMENTS

| | | | |
|---|---|---|---|
| 8,151,020 B2 | 4/2012 | Merry, Jr. et al. | |
| 9,454,202 B2 | 9/2016 | Jau et al. | |
| 9,634,486 B2 | 4/2017 | Park et al. | |
| 9,672,131 B2 | 6/2017 | Blount et al. | |
| 9,990,023 B2 | 6/2018 | Paley et al. | |
| 2012/0072755 A1 | 3/2012 | Jun | |
| 2014/0156920 A1* | 6/2014 | Chen | G06F 11/1441 711/103 |
| 2014/0244947 A1 | 8/2014 | Song | |
| 2015/0160718 A1* | 6/2015 | Cui | G06F 1/3203 713/320 |
| 2019/0035479 A1* | 1/2019 | Chen | G11C 16/30 |
| 2021/0165581 A1 | 6/2021 | Kwon | |

FOREIGN PATENT DOCUMENTS

| | | |
|---|---|---|
| EP | 3842897 | 6/2021 |
| JP | 2004-341592 | 12/2004 |
| JP | 2021-099773 | 7/2021 |
| KR | 10-2006-0082347 | 7/2006 |

* cited by examiner

*Primary Examiner* — Uyen Smet
(74) *Attorney, Agent, or Firm* — F. CHAU & ASSOCIATES, LLC

(57) ABSTRACT

A method of operating a storage device includes: sensing an external voltage supplied from a host device; selecting a data transfer mode, where the data transfer mode is either a normal mode or a brown-out mode according to the external voltage; and performing a write operation or a read operation according to the selected mode, wherein: the data transfer mode is selected as the normal mode when the external voltage is within a normal range between a first operation voltage and a second operation voltage, and the data transfer mode is selected as the brown-out mode when the external voltage is within a low power range below the normal range and between the second operation voltage and a power-off detection voltage; and wherein one or more types of input/output operations of the host device are supported in both the normal mode and the brown-out mode.

20 Claims, 18 Drawing Sheets

STORAGE DEVICE AND OPERATING METHOD THEREOF

CROSS-REFERENCE TO RELATED APPLICATION(S)

This application claims priority under 35 U.S.C. § 119 to Korean Patent Application No. 10-2021-0149698 filed on Nov. 3, 2021 in the Korean Intellectual Property Office, the disclosure of which is incorporated by reference herein in its entirety.

TECHNICAL FIELD

The present disclosure relates to a storage device and a method of operating the same.

DISCUSSION OF THE RELATED ART

Semiconductor devices such as smart phones, gaming systems, and the like, often include storage devices with memory to store data. These storage devices must be provided with power to carry out operations, such as read, write, and refresh operations.

Most storage devices are driven using an external power supply. A storage device may suffer from serious damage, such as data loss, due to an unexpected change in external power or external power-off (hereinafter referred to as "sudden power-off").

SUMMARY

Example embodiments provide a storage device, capable of performing input/output operations reliably, even in a low-voltage environment in which an input voltage environment is outside of a specification range, and a method of operating the storage device. Some embodiments determine a data transfer mode, and use an auxiliary power supply to ensure operations according to the data transfer mode. Other embodiments include the determination of the data transfer mode, and do not use an auxiliary power supply.

According to an example embodiment, a method of operating a storage device includes: sensing an external voltage supplied from a host device; selecting a data transfer mode, wherein the data transfer mode is either a normal mode or a brown-out mode according to the external voltage; and performing a write operation or a read operation according to the selected mode, wherein: the data transfer mode is selected as the normal mode when the external voltage is within a normal range between a first operation voltage and a second operation voltage, and the data transfer mode is selected as the brown-out mode when the external voltage is within a low power range below the normal range and between the second operation voltage and a power-off detection voltage; and wherein one or more types of input/output operations of the host device are supported in both the normal mode and the brown-out mode.

According to an example embodiment, a storage device includes: a current limiter configured to receive an external voltage and to limit current; at least one voltage regulator configured to receive the external voltage output from the current limiter, and to generate a first power supply voltage, a second power supply voltage, and a third power supply voltage; a voltage sensor configured to sense the external voltage; a NAND package configured to receive the first power supply voltage from the at least one voltage regulator, and including a plurality of NAND flash memory devices; a volatile memory device configured to receive the second power supply voltage from the at least one voltage regulator; and a controller configured to receive the third power supply voltage from the at least one voltage regulator and to control the NAND package and the volatile memory device, wherein: the controller receives a voltage information signal from the voltage sensor, and selects a data transfer mode, the data transfer mode being selected as either a normal mode or a brown-out mode in response to the voltage information signal; and wherein the normal mode is selected when the external voltage exists within a normal range between a first operation voltage and a second operation voltage, and the brown-out mode is selected when the external voltage exists within a low power range below the normal range and between the second operation voltage and a power-off detection voltage.

According to an example embodiment, a method of operating a storage device includes: monitoring an external voltage; determining whether the external voltage is lower than a minimum operation voltage; when the external voltage is lower than the minimum operation voltage, determining whether the external voltage is lower than a power-off detection voltage; performing an input/output operation according to a first brown-out mode when the external voltage is lower than the minimum operation voltage and higher than the power-off detection voltage; performing an input/output operation according to a normal mode when the external voltage is not lower than the minimum operation voltage; and dumping firmware when the external voltage is lower than the power-off detection voltage.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

In a storage device according to an example embodiment and a method of operating the same, an external voltage may be monitored, a normal mode or a brown-out mode may be selected based on a result of the monitoring, and an input/output request of a host may be performed according to the selected mode. The normal mode is a mode used to determine input/output operation when an external voltage exists within a normal range, and the brown-out mode is a mode used to determine input/output operation when a chip-drivable range exists below the normal range.

Figure 1:
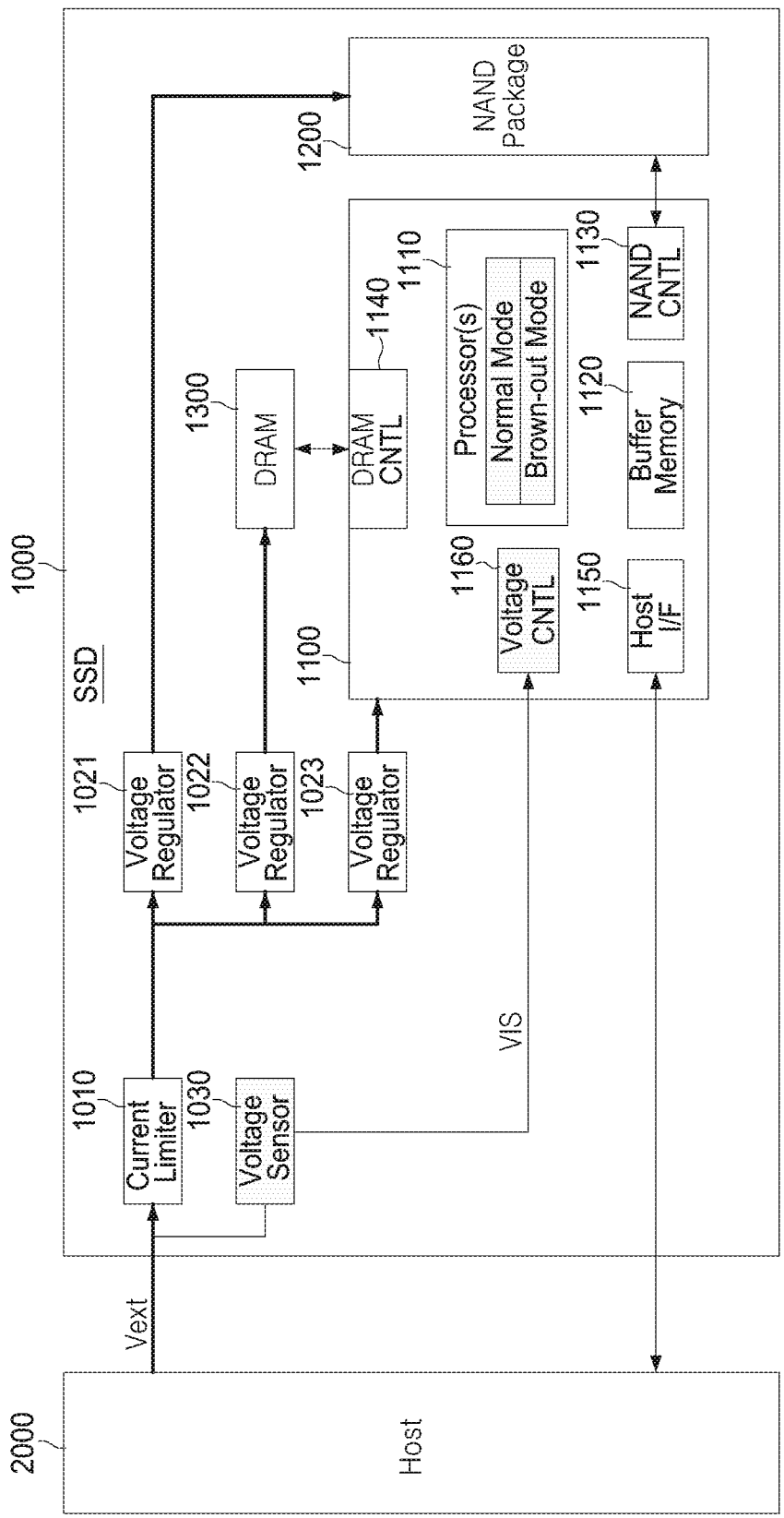
FIG. 1 is a diagram that illustrates a data storage according to an example embodiment.

FIG. 1 is a diagram that illustrates a data storage (SSD) 100 according to an example embodiment. Referring to FIG. 1, the storage device 100 may include a current limiter 1010, voltage regulators 1021, 1022, and 1023, a voltage sensor 1030, a controller 1100, a NAND package 1200, and a volatile memory device (DRAM) 1300.

The current limiter 1010 may be configured to receive the external voltage Vext from the host device 200 and to limit input current.

The voltage regulators 1021, 1022, and 1023 may be configured to generate voltages required for the corresponding internal devices 1100, 1200, and 1300 and to provide the generated voltages. For example, the voltage regulator 1021 may generate a voltage for the NAND package 1200, the voltage regulator 1022 may generate a voltage for the volatile memory device 1300, and the voltage regulator 1023 may generate a voltage for the controller 1100.

The voltage sensor 1030 may be configured to monitor a level of the external voltage Vext and to output the voltage information signal VIS. In an embodiment the voltage information signal VIS may indicate whether the external voltage Vext exists within a voltage range that corresponds to a normal mode or to a brown-out mode. For example, when the external voltage Vext exists within the normal range for a predetermined time, the voltage sensor 1030 may output a voltage information signal VIS having a low level. On the other hand, when the external voltage Vext exists within a range below the normal range for a predetermined time, the voltage sensor 1030 may output a voltage information signal VIS having a high level. It will be understood that the configuration and output method of the voltage sensor 1030 are not limited thereto. For example, in some embodiments, the voltage sensor 1030 may measure a number of external voltages, and be configured to determine the mode based on the number of voltages and a number of predetermined times.

The controller 1100 may be configured to control the overall operation of the storage device 1000. The controller 1100 includes at least one processor (CPU(s)) 1110, a buffer memory 1220, a NAND flash memory controller 1130, a volatile memory controller 1140, a host interface circuit 1150, and a voltage controller 1160.

The at least one processor 1110 may be configured to control the overall operation of the controller 1100. For example, the processor 1110 may control an input/output operation (e.g. a write operation or a read operation) according to a mode selected according to the voltage information signal VIS. For example, the processor 1110 may perform an input/output operation according to a normal mode or an input/output operation according to a brown-out mode. In some embodiments, an input/output operation between the host device 2000 and the storage device 1000 may be guaranteed in both the normal mode and the brown-out mode.

The processor 1110 may be configured to drive a direct memory access (DMA) engine. The DMA engine may control a direct memory access (DMA) operation of the storage device 1000. The DMA engine may perform data transmission with a host device or another external device under the control of the processor 1110. For example, the DMA engine may transmit read data, loaded to the volatile memory device 1300 in the form of a stream, to the host device 2000 in a DMA transfer mode. Alternatively, the DMA engine may store stream data, provided from the host device 2000, in the volatile memory device 1300 in the DMA transfer mode. Accordingly, the DMA engine may substantially perform the direct memory access (DMA) operations between the host device 2000 and the volatile memory device 1300.

The buffer memory 1120 may be configured to temporarily store data required for an operation of the controller 1100. The buffer memory 1220 may be implemented as a volatile memory, such as a static random access memory (SRAM), a dynamic RAM (DRAM), a synchronous RAM (SDRAM), or the like, or a nonvolatile memory, such as a flash memory, a phase-change RAM (PRAM), a magneto-resistive RAM (MRAM), a resistive RAM (ReRAM), a ferroelectric RAM (FRAM), or the like.

The NAND flash memory controller 1130 may be configured to control the NAND package 1200. The NAND flash memory controller 1130 may perform various management operations such as: cache/buffer management, firmware management, garbage collection management, wear-leveling management, data deduplication management, read refresh/reclaim management, bad block management, multistream management, host data and nonvolatile memory mapping management, quality of service (QoS) management, system resource allocation management, nonvolatile memory queue management, read level management, erase/program management, hot/cold data management, power loss protection management, dynamic thermal management, initialization management, redundant array of inexpensive disk (RAID) management, and the like.

The NAND flash memory controller 1130 may transmit a command and an address to a NAND flash memory device of the NAND package 1200 to perform a program operation, a read operation, an erase operation, and the like. The NAND flash memory controller 1130 may be connected to the NAND package 1200 through a plurality of control pins configured to transmit control signals, such as CLE, ALE, CE(s), WE, RE, and the like. Also, the NAND flash memory controller 1130 may be configured to control the NAND package 1200 using control signals CLE, ALE, CE(s), WE, RE, and the like.

For example, the NAND flash memory device may perform program/read/erase operations by latching a command or an address at an edge of a write enable signal WE and/or a read enable signal RE according to a command latch enable signal CLE and an address latch enable signal ALE. For example, during a read operation, a chip enable signal CE may be activated, the command latch enable signal CLE may be activated in a command transmission period, the address latch enable signal ALE may be activated in an address transmission period, and the read enable signal RE may be toggled in a period in which data is transmitted through a data signal line DQ. A data strobe signal DQS may be toggled at a frequency that corresponds to a data input/output speed. A plurality of pieces (such as blocks of a predetermined size) of read data may be sequentially transmitted in synchronization with the data strobe signal DQS.

In example embodiments, the NAND flash memory controller 1130 may be configured to comply with standard protocols such as Joint Electron Device Engineering Council (JEDEC) Toggle or Open NAND Flash Interface (ONFI).

The NAND flash memory controller 1130 may include an error correction code (ECC) circuit. The ECC circuit may generate an error correction code for correcting a failure bit or an error bit of data received from the NAND package 1200. The ECC circuit may perform error correction encoding on data, provided to the NAND package 1200, to generate data to which a parity bit is added. The parity bit may be stored in the NAND package 1200. In some embodiments, the ECC circuit may perform error correction decoding on data output from the NAND package 1200. The ECC circuit may correct an error using parity. The ECC circuit may correct an error using a Low Density Parity Check (LDPC) code, a Bose Chaudhuri Hocquenghem (BCH) code, a turbo code, a Reed-Solomon code, a convolution code, a Recursive Systematic Code (RSC), and/or coded modulations such as a Trellis-Coded Modulation (TCM) and a Block Coded Modulation (BCM). When an error is uncorrectable by the ECC circuit, a read retry operation may be performed.

In some embodiments, the NAND flash memory controller 1130 includes a flash translation layer (FTL) manager. The FTL manager may perform various functions such as address mapping, wear-leveling, and garbage collection.

In some embodiments, the NAND flash memory controller 1130 includes a security module. The security module may perform an encryption operation and/or a decryption operation on data input to the processor 1110, using, for example, a symmetric-key algorithm. The security module may include an encryption module and a decryption module. In example embodiments, the security module may be implemented in hardware, software, firmware, or a combination thereof. The security module may be configured to perform a security function of the storage device 1000. For example, the security module may perform a self-encryption disk (SED) function or a trusted computing group (TCG) security function.

The SED function may store encrypted data in the nonvolatile memory device 100 using an encryption algorithm, or may decrypt data encrypted from the nonvolatile memory device 100. Such encryption and decryption operations may be performed using an internally generated encryption key. In example embodiments, the encryption algorithm may be an Advanced Encryption Standard (AES) encryption algorithm. It will be understood that the encryption algorithm is not limited thereto. The TCG security function may provide a mechanism that allows access to user data of the storage device 1000 to be controlled. For example, the TCG security function may perform an authentication procedure between the external device and the storage device 1000. In example embodiments, the SED function or the TCG security function may be optionally selectable. In addition, the security module may be configured to perform an authentication operation with an external device or to perform a fully homomorphic encryption function.

The volatile memory controller 1140 may be configured to control the volatile memory device 1300. The volatile memory controller 1140 may write data to the volatile memory device 1300 or may read data, stored in the volatile memory device 1300, under the control of the processor 1110. The volatile memory controller 1140 may include a buffer allocation unit which functions as a buffer of the volatile memory device 1300. The buffer allocation unit may manage use and release of the volatile memory device 1300.

The host interface circuit 1150 may be configured to communicate with the host device 2000. The host interface circuit 1150 may be configured to transmit and receive packets to and from the host device 2000. A packet, transmitted from the host device 2000 to the host interface 1150, may include a command and/or data to be written to the NAND package 1200. A packet, transmitted from the host interface circuit 1150 to the host device 2000, may include a response to a command and/or data read from the NAND package 1200.

In example embodiments, the host interface circuit 1150 is compatible with one or more standards, such as a peripheral component interconnect express (PCIe) interface standard, a universal serial bus (USB) interface standard, a compact flash (CF) interface standard, a multimedia card (MMC) interface standard, an embedded MMC (eMMC) interface standard, a Thunderbolt interface standard, a universal flash storage (UFS) interface standard, a secure digital (SD) interface standard, a memory stick interface standard, an extreme digital (xD)-picture card interface standard, an integrated drive electronics (IDE) interface standard, a serial advanced technology attachment (SATA) interface standard, a small computer system interface (SCSI) interface standard, a serial attached SCSI (SAS) interface standard, and an enhanced small disk interface (ESD).

The voltage controller 1160 may be configured to receive the voltage information signal VIS from the voltage sensor 1030 and to determine a mode of input/output operation (e.g., a data transfer mode) in response to the voltage information signal VIS. For example, when receiving a voltage information signal VIS indicating that the external voltage Vext is within a normal range, the voltage controller 1160 may select a normal mode of the input/output operation as the data transfer mode. On the other hand, when receiving a voltage information signal VIS indicating that the external voltage Vext is within a range below the normal range, the voltage controller 1160 may select a brown-out mode of the input/output operation. The voltage controller 1160 may transmit the selected mode of the input/output operation to the processor 1110.

The NAND package 1200 may include at least one NAND flash memory device. In an embodiment, the NAND flash memory device may be implemented as a three-dimensional array structure. For example, the NAND flash memory device may be implemented as a vertical NAND flash memory device. The NAND package 1200 may be connected to the NAND flash memory controller 1130 through at least one channel. In an embodiment, a plurality of NAND flash memory devices may be connected to at least one channel. Each of the NAND flash memory devices may include a plurality of memory cells connected to wordlines and bitlines. Each of the plurality of memory cells may be configured to store at least one bit.

The volatile memory device 1300 may be used as a data buffer for data exchange between the storage device 1000 and the host device 2000. The volatile memory device 1300 may store a mapping table for mapping a logical address, provided to the storage device 1000, and an address of the NAND package 1200. The mapping table may be loaded to the volatile memory device 1300 from the NAND package 1200 during an initialization operation of the storage device 1000. The volatile memory device 1300 may temporarily store write data provided from the host device 2000 or data read from the NAND package 1200. When data present in the NAND package 1200 is cached, the volatile memory device 1300 may support a cache function which includes directly providing the cached data to the host device 2000, in response to a read request from the host device 2000. In example embodiments, the volatile memory device 1300 may be implemented as a dynamic random access memory (DRAM) to provide sufficient buffering in the storage device 1000.

In general, storage device cannot guarantee an operating range of an external voltage. However, the storage device 1000 according to an embodiment of the present disclosure may monitor an external voltage Vext and define a brown-out mode when the external voltage Vext is maintained a region below a normal range to guarantee an input/output operation, even within a range in which the external voltage Vext is outside of the normal range. In this way, the storage device 1000 according to the present inventive concepts may provide increased reliability and prevent data loss.

Figure 2:
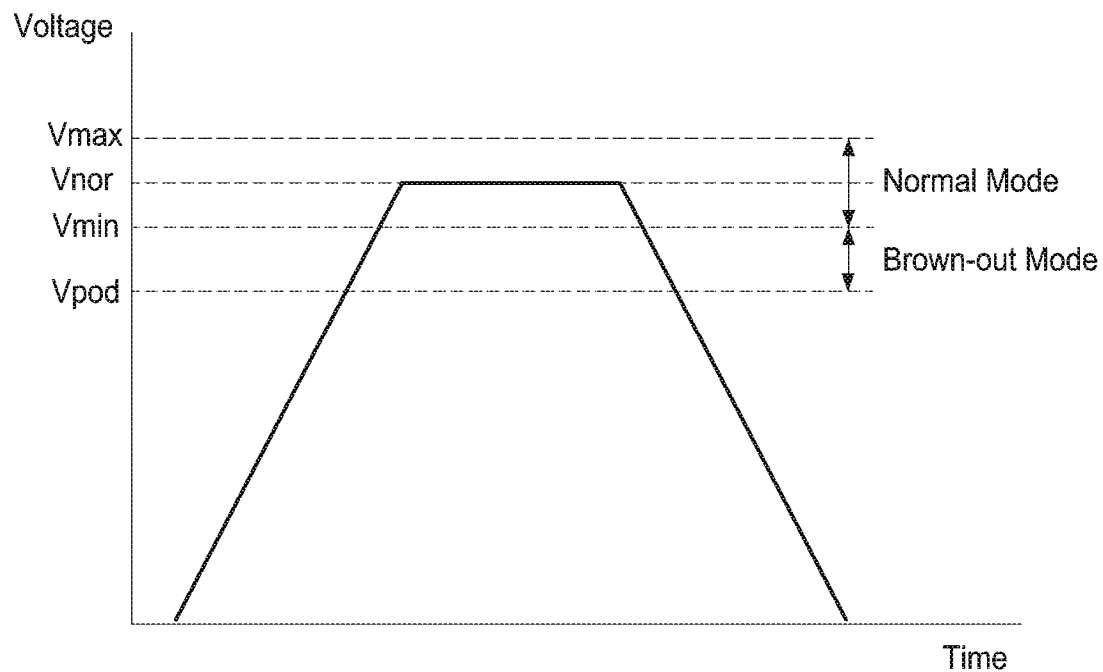
FIG. 2 is a diagram that illustrates a mode of input/output operation depending on a level of an external voltage according to an example embodiment.

FIG. 2 is a diagram that illustrates a mode of input/output operation (e.g., a data transfer mode) which depends on a level of an external voltage Vext according to an example embodiment.

When the external voltage Vext exists between a minimum operation voltage Vmin and a maximum operation voltage Vmax, a normal mode may be selected. In example embodiments, the minimum operation voltage Vmin may be 10.8 V, the maximum operation voltage Vmax may be 13.2 V, and a normal operation voltage Vnor may be 12 V. A normal range of the external voltage Vext may refer to the voltage range between the normal operation voltage Vnor and the minimum operation voltage Vmin. A low power range of the of the external voltage Vext may refer to the voltage range between the minimum operation voltage Vmin and a power-off detection voltage Vpod. However, embodiments of the present disclosure are not necessarily limited to these values or ranges.

When the external voltage Vext exists between the power-off detection voltage Vpod and a minimum operation voltage Vmin, a brown-out mode may be selected. In example embodiments, the power-off detection voltage Vpod may be 9.8 V.

It will be understood that values of the normal operation voltage Vnor, the maximum operation voltage Vmax, the minimum operation voltage Vmin, and the power-off detection voltage Vpod are not limited thereto.

Figure 3:
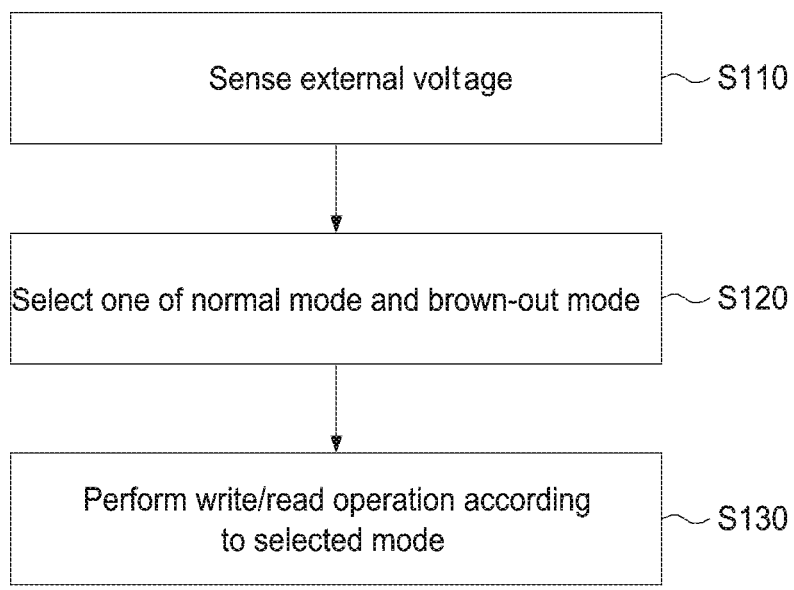
FIG. 3 is a flowchart that illustrates a method of operating a storage device according to an example embodiment.

FIG. 3 is a flowchart that illustrates a method of operating a storage device 1000 according to an example embodiment. Referring to FIGS. 1 to 3, the storage device 1000 may perform an input/output operation, as follows.

In operation S110, the storage device 1000 may sense at least one external voltage Vext provided from an external device (for example, the host device 2000 of FIG. 1). In operation S120, the storage device 1000 may select one of a normal mode and a brown-out mode according to the sensed external voltage Vext. In operation S130, the storage device 1000 may perform a write/read operation depending on the selected mode.

Figure 4:
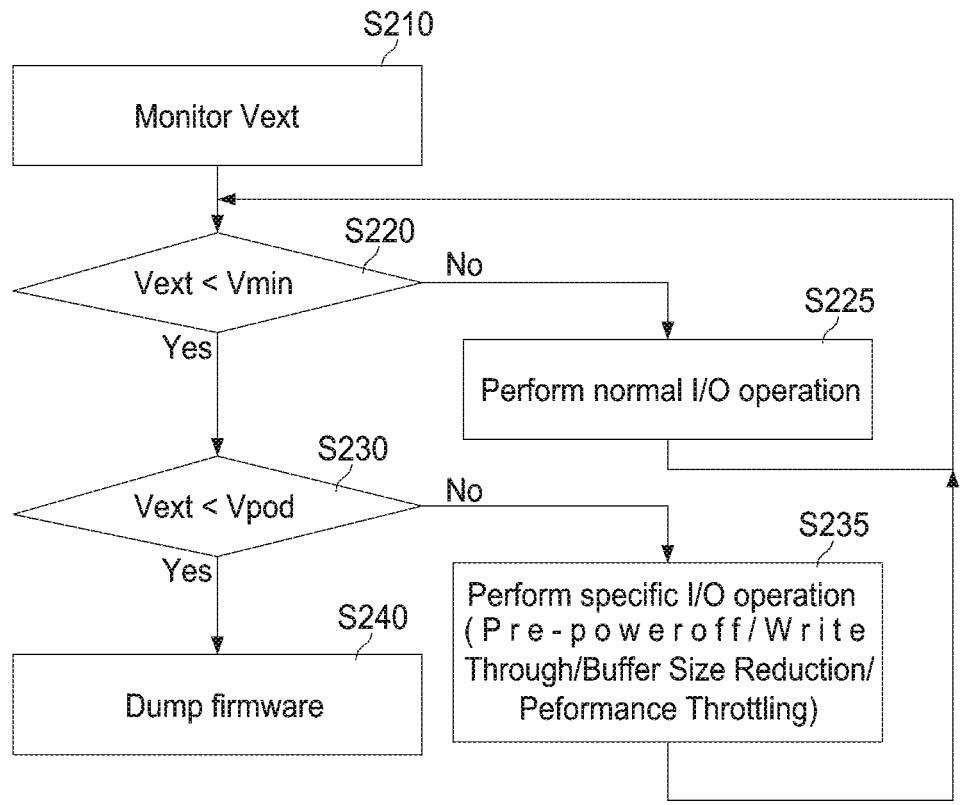
FIG. 4 is a flowchart that illustrates a method of operating a storage device according to another example embodiment.

FIG. 4 is a flowchart that illustrates a method of operating a storage device 1000 according to another example embodiment. Referring to FIGS. 1 to 4, the storage device 1000 may perform a power management operation in accordance with the following description.

In operation S210, the storage device 1000 may monitor an external voltage Vext. In operation S220, a determination may be made as to whether the external voltage Vext is lower than a minimum operation voltage Vmin. In operation S225, when the external voltage Vext is not lower than the minimum operation voltage Vmin, a input/output operation according to a normal mode may be performed. In operation S230, when the external voltage Vext is lower than the minimum operation voltage Vmin, a determination may be made as to whether the external voltage Vext is lower than the power-off detection voltage Vpod. In S235, when the external voltage Vext is not lower than the power-off detection voltage Vpod, a special input/output operation according to a brown-out mode may be performed. The special input/output operation may include a pre-power-off operation, a write through operation, a buffer size reduction operation, or a performance throttling operation.

In operation S240, when the external voltage Vext is lower than the power-off detection voltage Vpod, at least one firmware program for driving the storage device 1000 may be dumped (e.g., transferred) to the NAND package 1200.

In some embodiments, the storage device 1000 may be equipped with a power loss protection function.

Figure 5:
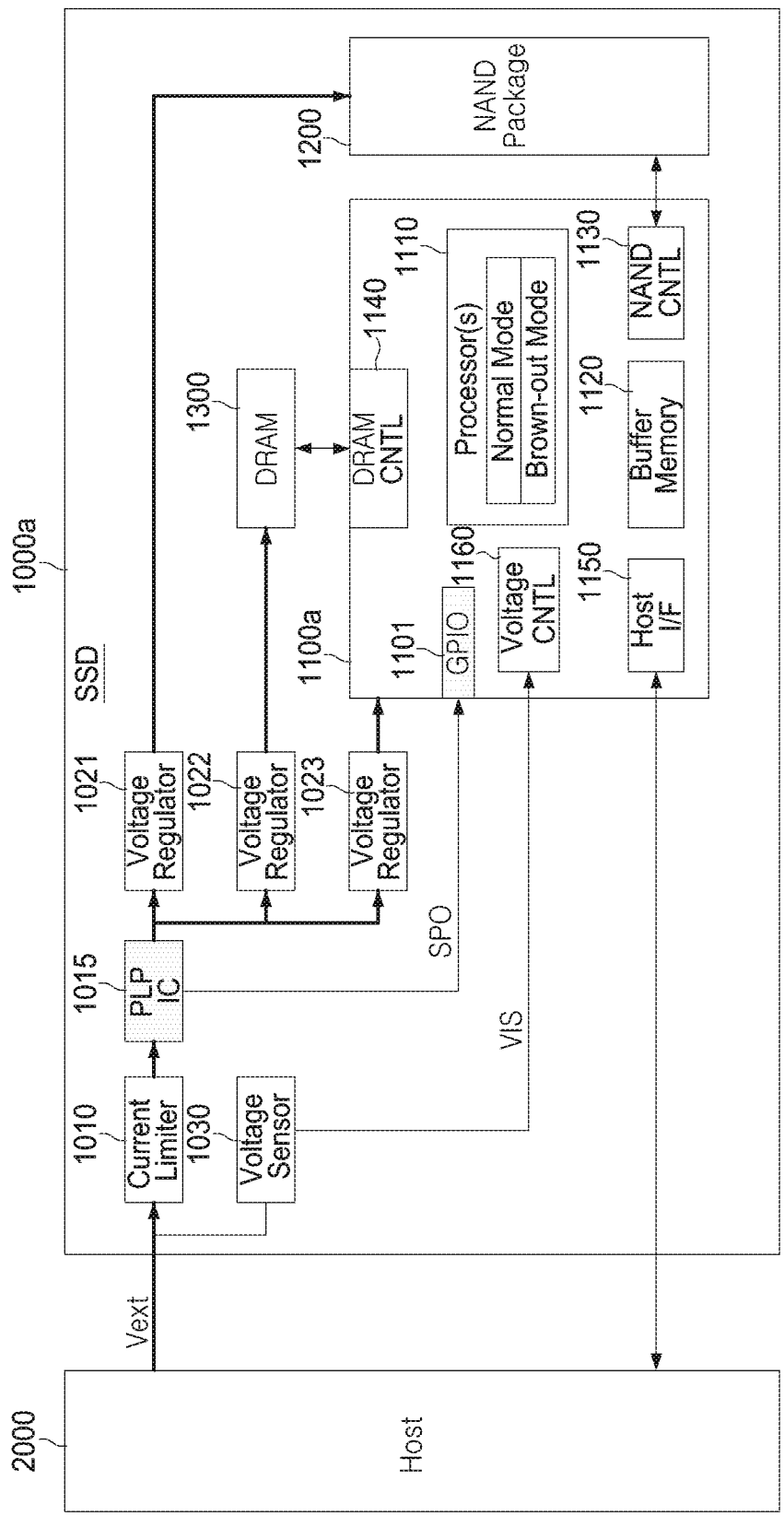
FIG. 5 is a diagram that illustrates a storage device according to another example embodiment.

FIG. 5 is a diagram that illustrates a storage device 1000*a* according to another example embodiment. Referring to FIG. 5, the storage device 1000*a* is similar to the storage device 1000 illustrated in FIG. 1, but further includes a power loss prevention circuit (PLP IC) 1015, as compared with.

The power loss prevention circuit 1015 may be configured to receive an external voltage Vext and perform a power loss prevention function. The power loss prevention circuit 1015 may output a power-off detection signal SPO according to the external voltage Vext. The power-off detection signal SPO may use a general purpose input/output (GPIO) signal. For example, the power-off detection signal SPO may be output to the GPIO pin 1101 of a controller 1100*a*.

Figure 6:
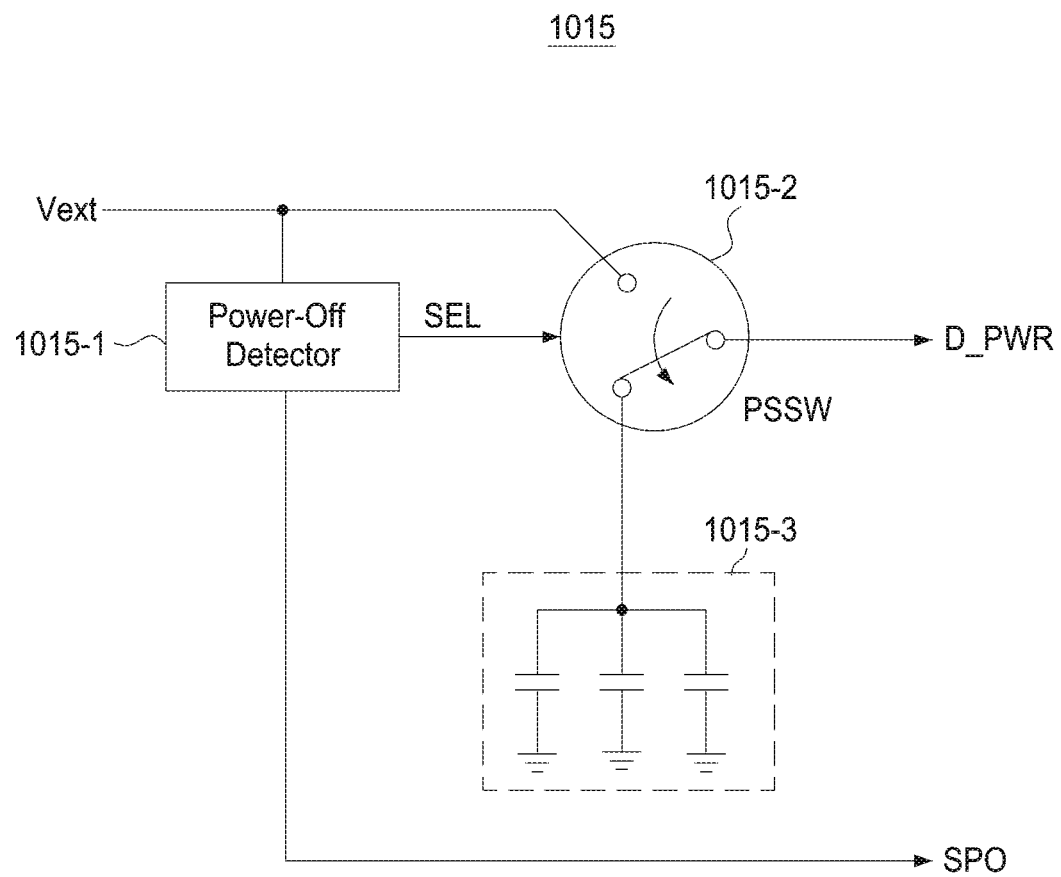
FIG. 6 is a diagram that illustrates a power loss prevention circuit illustrated in FIG. 5.

FIG. 6 is a diagram that illustrates a power loss prevention circuit illustrated in FIG. 5. Referring to FIG. 6, a power loss prevention circuit 1015 may include a power-off detector 1015-1, power selection switches PSSW and 1015-2, and an auxiliary power supply 1015-3.

The power-off detector 1015-1 may monitor a level of the external voltage Vext and generate a power selection signal SEL and a power-off detection signal SPO based on a result of the monitoring. The power-off detector 1015-1 may detect when the external voltage Vext is cut off or when a value of the external voltage Vext drops below a reference value, and may determine the voltage change a power-off event. In this case, the power-off detector 1015-1 may control the power selection switch 1015-2 such that the power selection switch 1015-2 routes to the auxiliary power supply 1015-3, rather than to the external voltage Vext. In addition, the power-off detector 1015-1 may transmit a power-off detection signal SPO to trigger a backup operation of a controller 1100*a*. The power-off detection signal SPO may be transmitted through a GPIO interface.

The power selection switch 1015-2 may provide the external voltage Vext or the auxiliary power supply 1015-3 as device power D_PWR according to the power selection signal SEL provided from the power-off detector 1015-1. In a situation in which the external voltage Vext is normally supplied, the power-off detector 1015-1 may control the power selection switch 1015-2 such that the power selection switch 1015-2 provides or routes the external voltage Vext into the device power D_PWR. When the power-off detector 1015-1 detects a power-off event, the power selection switch 1015-2 may select the auxiliary power supply 1015-3 as the device power D_PWR.

The auxiliary power supply 1015-3 may be configured to accumulate energy provided from the external voltage when the external voltage Vext is supplied. For example, the auxiliary power supply 1015-3 may include at least one capacitor for accumulating electric charges. The auxiliary power supply 1015-3 may store an amount of energy sufficient to perform a backup operation of the storage device 1000. Accordingly, the capacitor may include capacitive devices having high stability. For example, the at least one capacitor may include an electrolytic capacitor, a film capacitor, a tantalum capacitor, and a ceramic capacitor (for example, a multilayer ceramic capacitor (MLCC)). It will be understood that an auxiliary power supply in example embodiments is not limited thereto.

Figure 7:
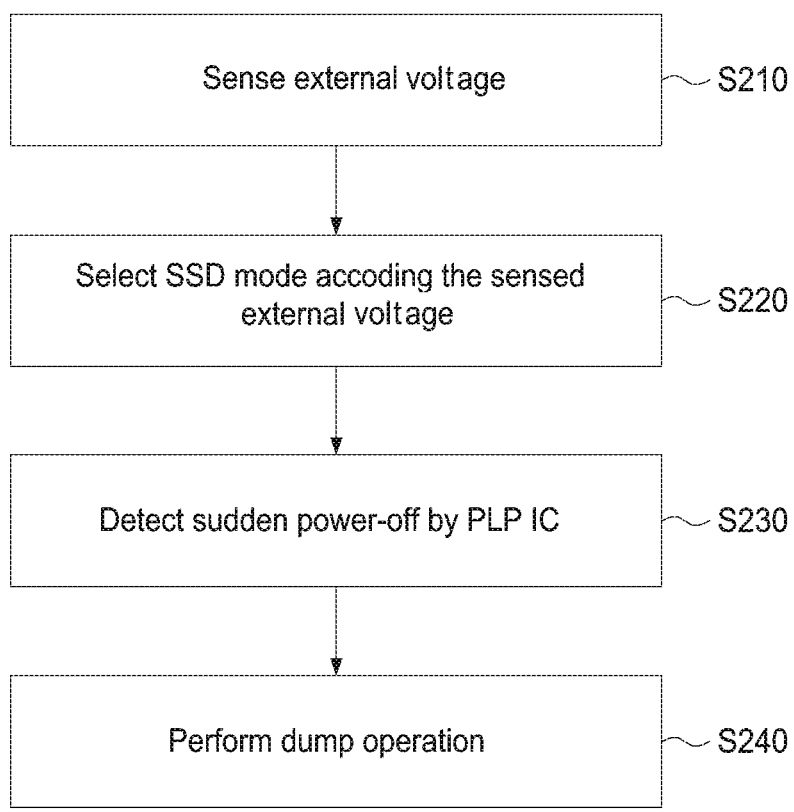
FIG. 7 is a flowchart that illustrates a method of operating a storage device according to sudden power-off in an example embodiment.

FIG. 7 is a flowchart that illustrates a method of operating a storage device 1000a according to sudden power-off in an example embodiment. Referring to FIGS. 5 to 7, the storage device 1000a may operate in response to sudden power-off as follows.

In operation S210, the storage device 1000a may sense the external voltage Vext. In operation S220, the storage device 1000a may select an SSD mode according to the sensed external voltage Vext. The SSD mode may refer to a normal mode or a brown-out mode of an input/output operation described with reference to FIGS. 1 to 4, and is synonymous with data transfer mode. The controller 1100a may perform an input/output operation according to the selected SSD mode. In operation S230, sudden power-off may be detected by the power loss prevention circuit 1015. Responsive to the detection of the sudden-power-off, the power loss prevention circuit 1015 may output the power-off detection signal SPO through the GPIO interface. In operation S240, the controller 1100a may perform a dump operation in response to the power-off detection signal SPO.

In general, a storage device for business or a data center is equipped with a power loss prevention function that is employed in a case in which power input supplied from a host device is suddenly cut off. A criterion for enabling the power loss prevention function includes determining that a power input supplied from the host device is decreased to a specific voltage (for example, a power-off detection voltage Vpod). In this case, it may be determined that the host device is not in a normal state to operate a storage device. When it is determined that the voltage is unstable, the storage device may stop data introduced from the host device and may move data from a volatile memory device (for example, a DRAM) to a nonvolatile memory device (for example, a NAND flash memory). When power-off is detected, a backup operation of data in the volatile memory is referred to as a dumping operation.

The storage device according to an example embodiment may further include a new memory.

Figure 8:
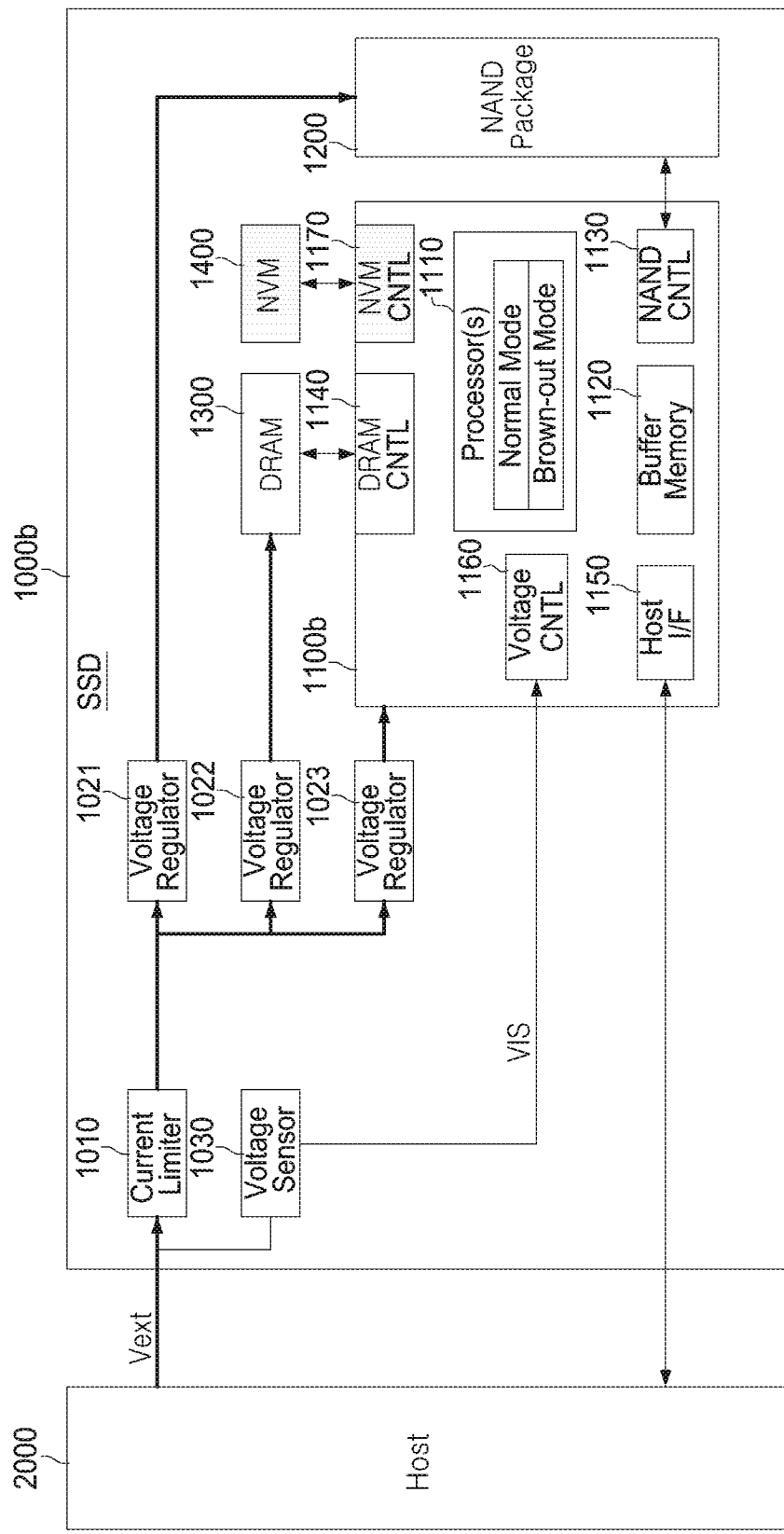
FIG. 8 is a diagram that illustrates a storage device according to another example embodiment.

FIG. 8 is a diagram that illustrates a storage device 1000b according to another example embodiment. Referring to FIG. 8, the storage device 1000b is similar to the storage device 1000 illustrated in FIG. 1, but further includes a nonvolatile memory device (NVM) 1400 performing a buffer function.

The controller 1100b may include a non-volatile memory controller 1170 controlling the nonvolatile memory device 1400. The nonvolatile memory device 1400 may include a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), or the like. The nonvolatile memory device 1400 may include a memory other than a NAND flash memory device.

In an example embodiment, in a brown-out mode, a write operation may be performed on the nonvolatile memory device 1400. In an example embodiment, in a brown-out mode, a dumping operation may include an operation of moving data from the volatile memory device 1300 to the nonvolatile memory device 1400.

Figure 9:
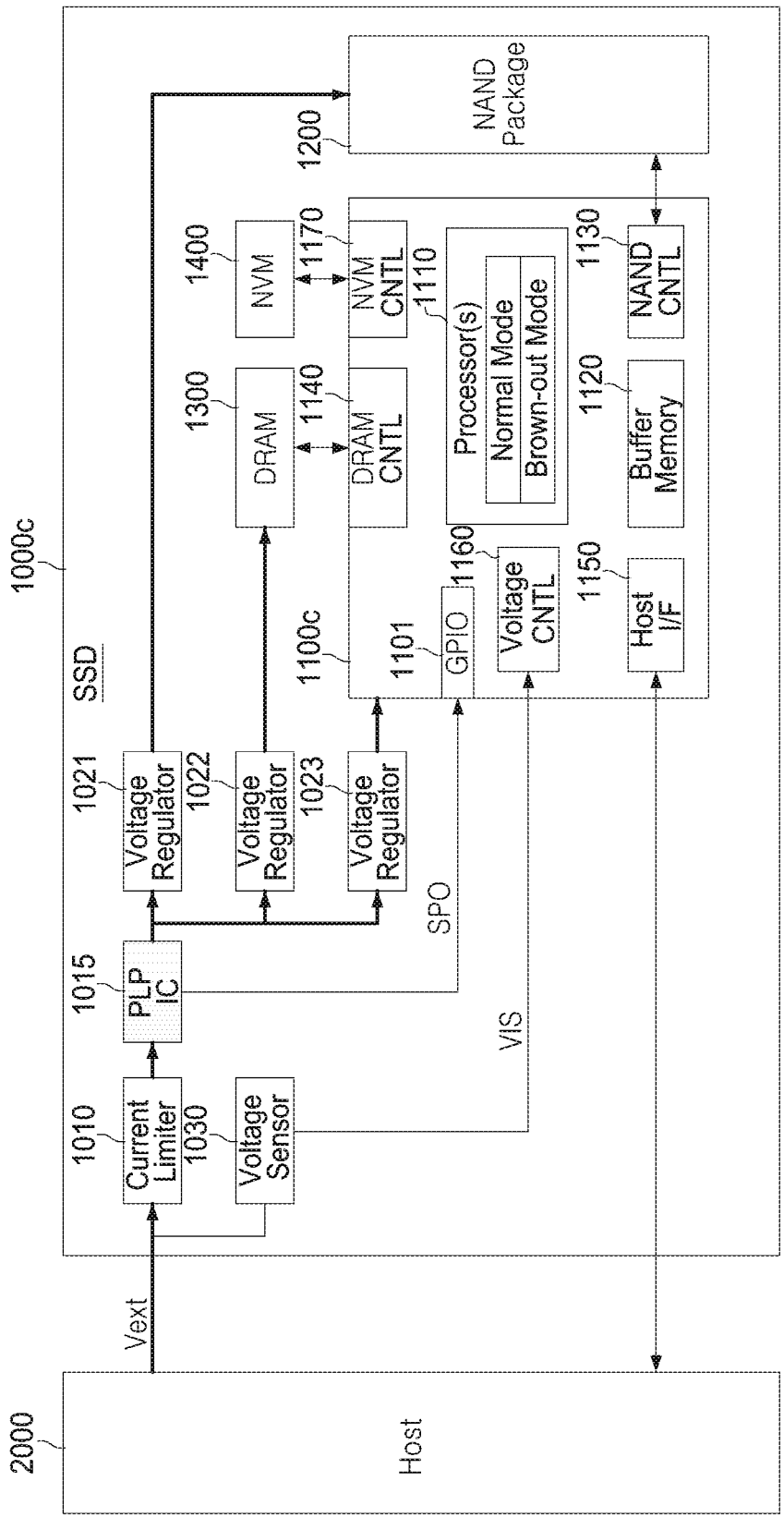
FIG. 9 is a diagram that illustrates a storage device according to another example embodiment.

FIG. 9 is a diagram that illustrates a storage device 1000c according to another example embodiment. Referring to FIG. 9, the storage device 1000c may further include a power loss prevention circuit (PLP IC) 1015, unlike the storage device 1000b illustrated in FIG. 8. The controller 1100c may perform a dumping operation according to a power-off detection signal SPO of the power loss prevention circuit 1015.

FIGS. 10A to 10F are diagrams that illustrate various embodiments depending on a mode of input/output operation (e.g., the data transfer mode). For example, FIGS. 10A to 10F are illustrative of the input/output operations available to the storage device based on the current data transfer mode of the storage device.

Figure 10A:
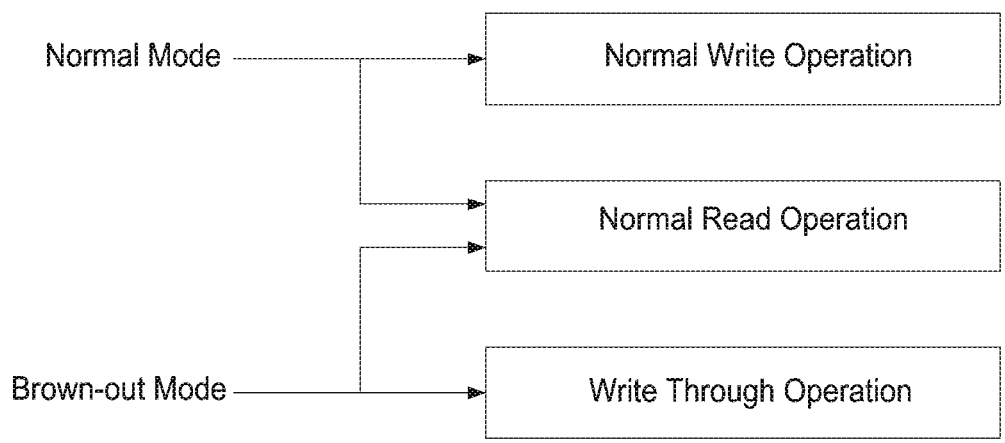
FIGS. 10A to 10F are diagrams that illustrate various embodiments depending on a mode of input/output operation.

Referring to FIG. 10A, a normal write operation and a normal read operation may be performed in a normal mode. A write through operation and the normal read operation may be performed in a brown-out mode.

Figure 10B:
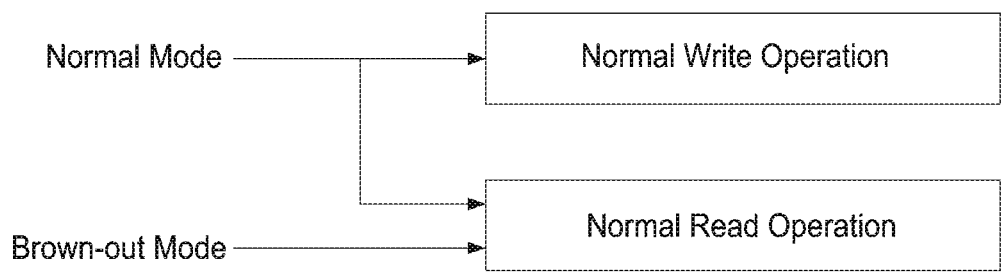
Figure 10C:
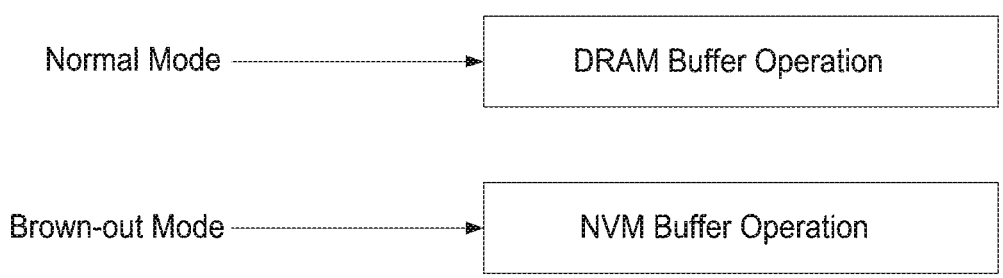

Referring to FIG. 10B, only a normal read operation may be performed in a brown-out mode Referring to FIG. 10C, a DRAM buffering operation may be performed in a normal mode, and an NVM buffering operation may be performed in a brown-out mode.

Figure 10D:
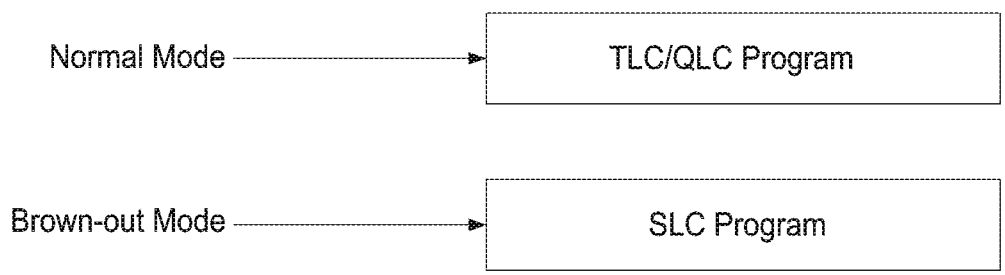

Referring to FIG. 10D, a multi-level cell (MLC)/a triple-level cell (TLC)/a quad-level cell (QLC) program operation may be performed on a NAND package in a normal mode, and the single level cell (SLC) program operation may be performed in a brown-out mode.

Figure 10E:
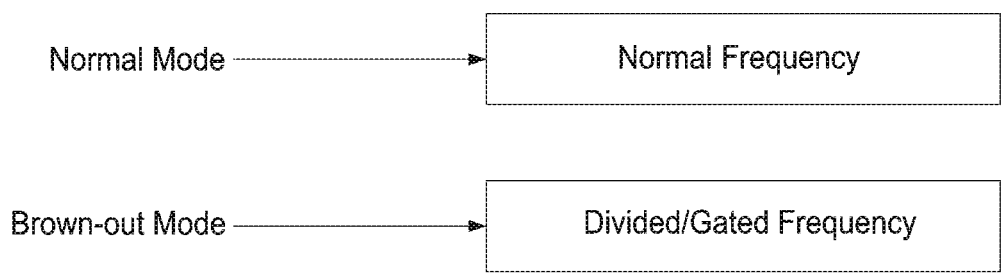

Referring to FIG. 10E, an operation may be performed at a normal frequency in a normal mode, and an operation may be performed at a divided/gated frequency in a brown-out mode.

Figure 10F:
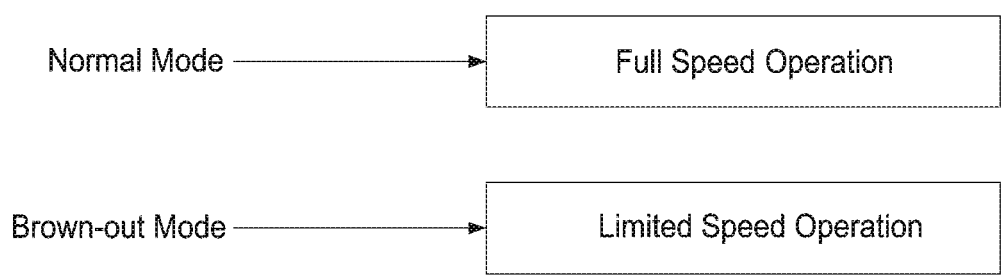

Referring to FIG. 10F, an operation may be performed at full speed in a normal mode, and an operation may be performed at limited speed in a brown-out mode.

According to example embodiments, an input/output operation may be additionally ensured in a brown-out mode based on the external voltage Vext being above the normal range of an external voltage Vext, as well as in a brown-out mode based on the external voltage Vext being below the normal range of the external voltage Vext.

Figure 11:
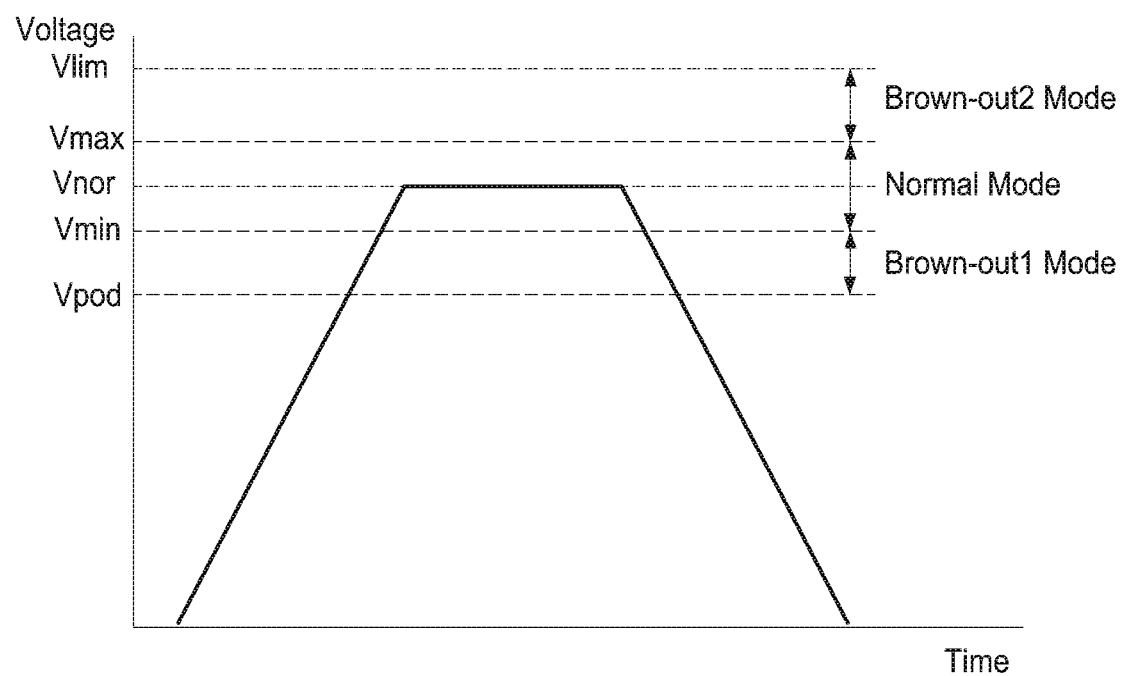
FIG. 11 is a diagram that illustrates an operating mode of a storage device according to another example embodiment.

FIG. 11 is a diagram that illustrates an operating mode of a storage device according to another example embodiment. Referring to FIG. 11, an input/output operation of the storage device may be performed when the external voltage Vext exists between a maximum operation voltage Vmax and a limited operation voltage Vlim, or may further include a brown-out mode (or an over-voltage mode), as compared with that illustrated in FIG. 2.

In an example embodiment, the input/output operation in the first brown-out mode may be performed when the external voltage Vext is within a specification range between the power-off voltage Vpod and the minimum operation voltage Vmin.

In an example embodiment, the input/output operation in the second brown-out mode may be performed when the external voltage Vext is within a region higher than the specification range of Vpod to Vmin. The region higher than the specification range may be determined to be higher than the maximum operation voltage Vmax and lower than the limited operation voltage Vlim.

In an example embodiment, a charging function of the auxiliary power supply may be performed in, but is not limited to, a second brown-out mode of the input/output operation.

The storage device according to an example embodiment may further include an artificial intelligence processor configured to determine a normal mode, a brown-out mode, and/or an over-voltage mode of the input/output operation based on the external voltage Vext. Such an artificial intelligence processor may determine a lowest mode using a monitored external voltage Vext through machine learning. A machine learning unit may operate based on or execute instructions configured to implement at least one of various machine learning algorithms such as neural network, support vector machine (SVM), linear regression, decision tree, generalized linear models (GLM), random forests, gradient boosting machine (GBM), deep learning, clustering, anomaly detection, and dimension reduction.

Figure 12:
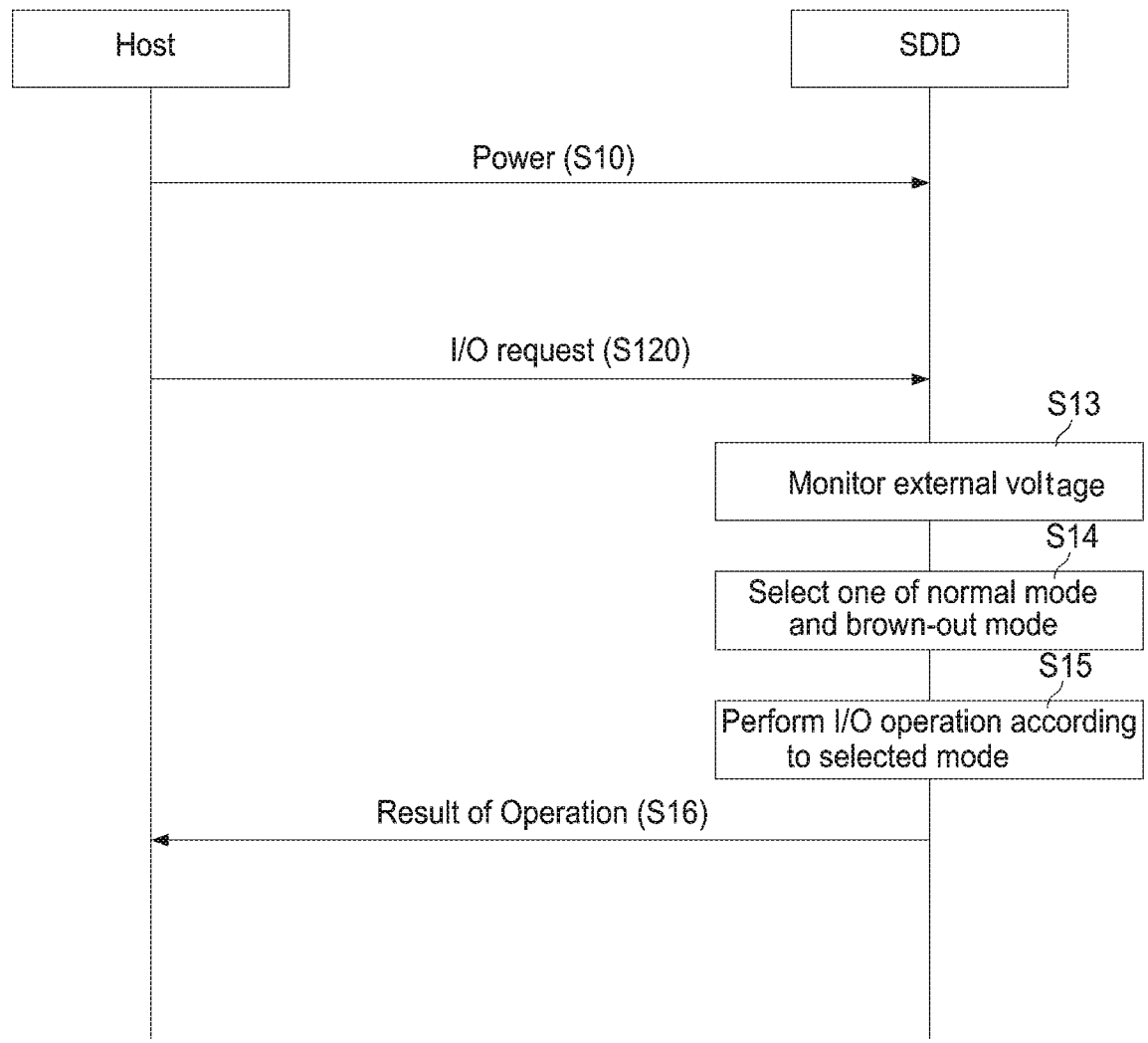
FIG. 12 is a ladder diagram that illustrates an operation of a host system according to an example embodiment.

FIG. 12 is a ladder diagram that illustrates an operation of a host system according to an example embodiment. Referring to FIGS. 1 to 12, the operation of the host system may be performed, as follows.

In operation S10, the host device may supply power (an external voltage Vext) to the storage device SSD. In operation S12, the host device may transmit an input/output request (a write request or a read request) to the storage device SSD. In operation S13, the storage device SSD may monitor the external voltage Vext. The storage device SSD may determine an operating mode of the input/output operation according to the monitored external voltage Vext. In operation S14, for example, the storage device SSD may select either the normal mode or the brown-out mode depending on the external voltage Vext. In operation S15, the storage device SSD may perform an input/output operation corresponding to the input/output request of the host device according to the selected mode. In operation S16, the host device SSD may transmit a result of the input/output request to the host device.

The storage device in example embodiments may be applied to a data server system.

Figure 13:
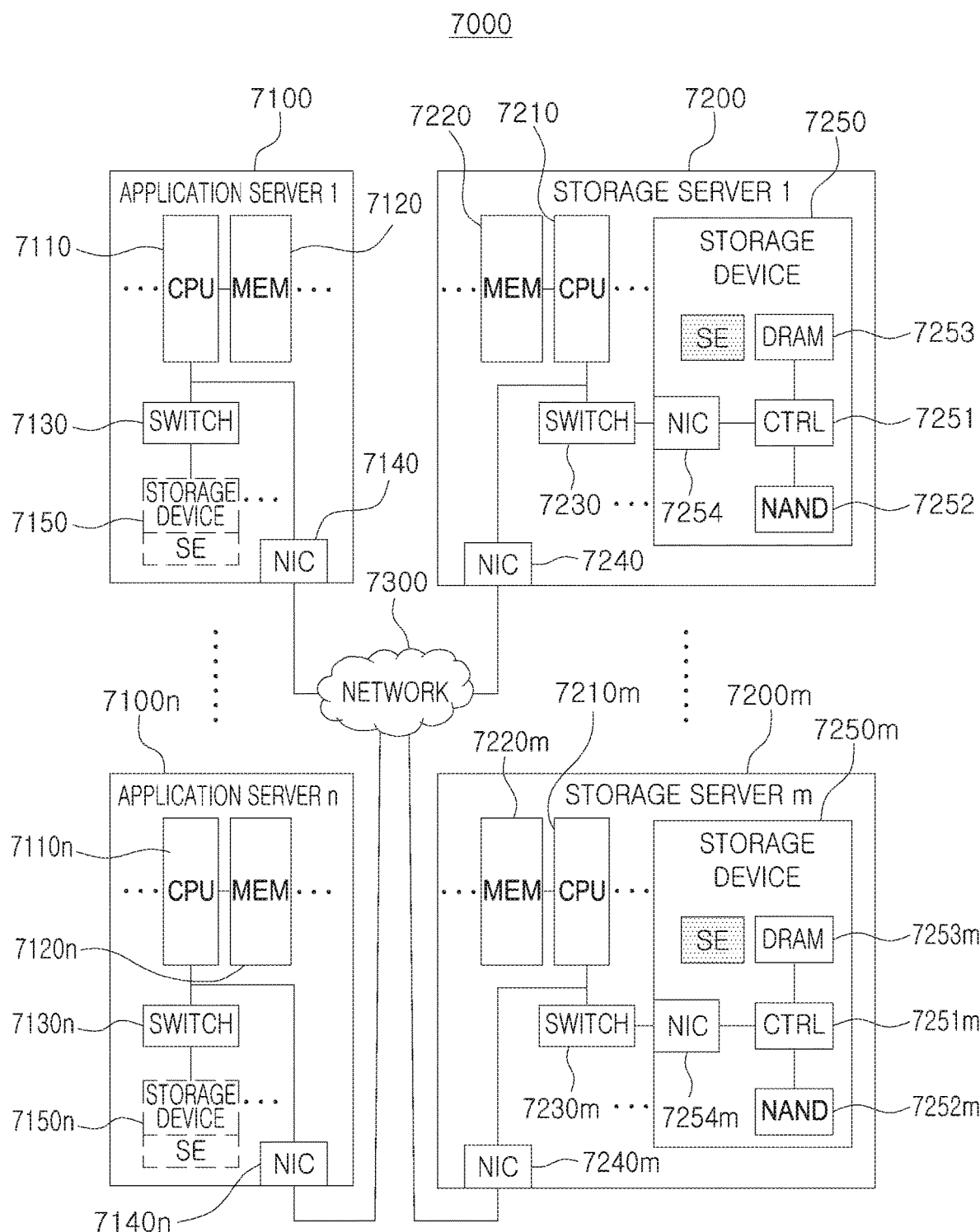
FIG. 13 is a diagram that illustrates a data center to which a memory device according to an example embodiment is applied.

FIG. 13 is a diagram that illustrates a data center to which a memory device according to an example embodiment is applied. Referring to FIG. 13, a data center 7000 is a facility which collects various types of data and provides services, and may also be referred to as a data storage center. The data center 7000 may be a system for operating a search engine and a database or may be a computing system used by companies such as banks or government agencies for processing and/or storing data. The data center 7000 may include application servers 7100 to 7100n and storage servers 7200 to 7200m. The number of application servers 7100 to 7100n and the number of storage servers 7200 to 7200m may vary according to example embodiments, and the number of application servers 7100 to 7100n and the number of storage servers 7200 to 7200m may be different from each other.

The application server 7100 or the storage server 7200 may include at least one of processors 7110 and 7210 and at least one of memories 7120 and 7220. Referring to the storage server 7200 as an example, the processor 7210 may control the overall operation of the storage server 7200 and may access the memory 7220 to execute instructions and/or data loaded to the memory 7220. The memory 7220 may be a double data rate synchronous DRAM (DDR SDRAM), a high bandwidth memory (HBM), a hybrid memory cube (HMC), a dual in-line memory module (DIMM), an optane DIMM, or a nonvolatile DIMM (NVDIMM). The number of processors 7210 and the number of memories 7220, included in the storage server 7200, may vary according to example embodiments. In an example embodiment, the processor 7210 and memory 7220 may provide a processor-memory pair. In an example embodiment, application server 7100 or the storage server 7200 may include various components on a single package. In an example embodiment, the number of the processors 7210 and the number of the memories 7220 may be different from each other. The processor 7210 may include a single-core processor or a multi-core processor. The above description of the storage server 7200 may be similarly applied to the application server 7100. According to an example embodiment, the application server 7100 may not include a storage device 7150. The storage server 7200 may include at least one storage device 7250. The number of storage devices 7250, included in the storage server 7200, may vary according to example embodiments.

The application servers 7100 to 7100n and the storage servers 7200 to 7200m may communicate with each other through a network 7300. The network 7300 may be realized using a fiber channel (FC) or Ethernet. The FC may be a medium used for relatively high-speed data transmission, and may include an optical switch providing high performance/high availability. Depending on an access method of the network 7300, the storage servers 7200 to 7200m may be provided as a file storage, a block storage, or an object storage.

In an example embodiment, the network 7300 may be a storage-only network such as a storage area network (SAN). For example, the SAN may be an FC-SAN using an FC network and implemented according to an FC protocol (FCP). As another example, the SAN may be an IP-SAN using a TCP/IP network and implemented according to an iSCSI (SCSI over TCP/IP or Internet SCSI) protocol. In another example embodiment, the network 7300 may be a general network such as a TCP/IP network. For example, the network 7300 may be implanted according to a protocol such as FC over Ethernet (FCoE), network attached storage (NAS), NVMe over Fabrics (NVMe-oF), or the like.

Hereinafter, the application server 7100 and the storage server 7200 will be mainly described. The description of the application server 7100 may also be applied to other application servers including 7100n, and the description of the storage server 7200 may also be applied to other storage servers including 7200m.

The application server 7100 may store data, requested to be stored by a user or a client, in one of the storage servers 7200 to 7200m through the network 7300. In addition, the application server 7100 may obtain data, requested to be read by the user or the client, from one of the storage servers 7200 to 7200m through the network 7300. For example, the application server 7100 may be implemented as a web server, a database management system (DBMS), or the like.

The application server 7100 may access a memory 7120n or a storage device 7150n, included in another application server 7100n, through the network 7300, or may access the memories 7220 to 7220m or storage devices 7250 to 7250m, included in the storage servers 7200 to 7200m, through the network 7300. Accordingly, the application server 7100 may perform various operations on data stored in the application servers 7100 to 7100n and/or on data stored in storage servers 7200 to 7200m. For example, the application server 7100 may execute a command to move or copy data between the application servers 7100 to 7100n and/or the storage servers 7200 to 7200m. In this case, the data may be moved directly from the storage devices 7250 to 7250m of the storage servers 7200 to 7200m to the memories 7120 to 7120n of the application servers 7100 to 7100n or through the memories 7220 to 7220m of the storage servers 7200 to 7200m via the network 7300. The data, moved through the network 7300, may be encrypted data for security or privacy.

Referring to the storage server 7200 as an example, the interface 7254 may provide a physical connection between the processor 7210 and the controller 7251 and a physical connection between the NIC 7240 and the controller 7251. For example, the interface 7254 may be implemented by a direct attached storage (DAS) that directly connects the storage device 7250 to a specific-purpose cable. In addition, for example, the interface 7254 may be implemented by various interface methods such as advanced technology attachment (ATA), serial ATA (SATA), external SATA (e-SATA), small computer small interface (SCSI), serial attached SCSI (SAS), peripheral component interconnection (PCI), PCI express (PCIe), NVM express (NVMe), IEEE 1394, universal serial bus (USB), secure digital (SD) card, multi-media card (MMC), embedded multi-media card (e-MMC), universal flash storage (UFS), embedded universal flash storage (eUFS), compact flash (CF) card interface.

The storage server 7200 may further include a switch 7230 and a NIC 7240. The switch 7230 may selectively connect the processor 7210 to the storage device 7250 under the control of the processor 7210, and/or may selectively connect the NIC 7240 and the storage device 7250.

In an example embodiment, the NIC 7240 may include a network interface card, a network adapter, and the like. The NIC 7240 may be connected to the network 7300 by a wired interface, a wireless interface, a Bluetooth interface, an optical interface, or the like. The NIC 7240 may include an internal memory, a DSP, a host bus interface, and the like and may be connected to the processor 7210 and/or the switch 7230 through the host bus interface. The host bus interface may be implemented as one of the examples of the interface 7254 described above. In an example embodiment, the NIC 7240 may be incorporated with (e.g. disposed in the same package or directly connected to) at least one of the processor 7210, the switch 7230, and the storage device 7250.

In the storage servers 7200 to 7200m or the application servers 7100 to 7100n, the processor may transmit a command to the storage devices 7130 to 7130n and 7250 to 7250m or the memories 7120 to 7120n and 7220 to 7220m to program data or read data. In this case, the data may be data error-corrected through an error correction code (ECC) engine. The data may be data subjected to data bus inversion (DBI) or data masking (DM), and may include cyclic redundancy code (CRC) information. The data may be data encrypted for security or privacy.

The storage devices 7150 to 7150n and 7250 to 7250m may transmit a control signal and a command/address signal to NAND flash memory devices 7252 to 7252m in response to a read command received from the processor. Accordingly, when data is read from the NAND flash memory devices 7252 to 7252m, a read enable signal RE may be input as a data output control signal to serve to output data to a DQ bus. A data strobe DQS may be generated using the read enable signal RE. The command and address signal may be latched to a page buffer according to a rising edge or a falling edge of a write enable signal WE.

In example embodiments, the storage devices 7150 to 7150n and 7250 to 7250m may determine an operating mode of an input/output operation (e.g., a data transfer mode) according to the storage described with reference to FIGS. 1 to 12 and a method of operating the same.

The controller 7251 may control the overall operation of the storage device 7250. In an example embodiment, the controller 7251 may include a static random access memory (SRAM). The controller 7251 may write data into the NAND flash 7252 in response to a write command or may read data from the NAND flash 7252 in response to a read command. For example, the write command and/or the read command may be provided from the processor 7210 in the storage server 7200, the processor 7210m in another storage server 7200 m, or the processors 7110 to 7110n in the application servers 7100 to 7100n. A DRAM 7253 may temporarily store (buffer) the data written to the NAND flash 7252 or data read from the NAND flash 7252. In addition, the DRAM 7253 may store metadata. The metadata includes user data or data generated by the controller 7251 to manage the NAND flash 7252.

In the storage device according to an example embodiment and a method of operating the same, data transfer operations may be reliably performed even in a low-voltage environment in which an input voltage environment is outside of a specification range.

As described above, an external voltage may be monitored, and an input/output operation according to a normal mode or a brown-out mode may be performed based on the external voltage.

In an embodiment, a brown-out mode below a normal range may be provided to increase reliability of an input/output request of a host.

While example embodiments have been shown and described above, it will be apparent to those skilled in the art that modifications and variations may be made without departing from the scope of the present inventive concept as defined by the appended claims.

What is claimed is:

1. An operating method of a storage device, the method comprising:
   sensing an external voltage supplied from a host device;
   selecting a data transfer mode, wherein the data transfer mode is either a normal mode or a brown-out mode depending upon the external voltage; and
   performing a write operation or a read operation according to the selected mode, wherein:
   the data transfer mode is selected as the normal mode when the external voltage is within a normal range between a first operation voltage and a second operation voltage, and the data transfer mode is selected as the brown-out mode when the external voltage is within a low power range below the normal range and between the second operation voltage and a power-off detection voltage,
   wherein the first operation voltage is a maximum operation voltage of the normal range and the second operation voltage is a minimum operation voltage of the normal range,
   wherein the storage device supports a write through operation and a nonvolatile memory device (NVM) buffer operation in both the normal mode and the brown-out mode, and
   wherein an operation speed of the brown-out mode is different than an operation speed of the normal mode.

2. The method of claim 1, wherein:
   the sensing the external voltage comprises determining whether the external voltage is lower than the second operation voltage.

3. The method of claim 2, wherein:
the performing the write operation or the read operation comprises a normal write operation or a normal read operation when the external voltage is within the normal range.

4. The method of claim 2, wherein:
the sensing the external voltage further comprises determining whether the external voltage is lower than the power-off detection voltage when the external voltage is lower than the second operation voltage.

5. The method of claim 4, wherein:
the performing the write operation or the read operation further comprises performing a specific input/output operation when the external voltage is below the second operation voltage but not lower than the power-off detection voltage.

6. The method of claim 4, further comprising:
performing a dumping operation to move data of a buffer memory to a nonvolatile memory device when the external voltage is lower than the power-off detection voltage.

7. The method of claim 1, wherein:
a specific input/output operation is performed when the data transfer mode is the brown-out mode.

8. The method of claim 7, wherein:
the specific input/output operation includes at least one of: a pre-power-off operation, a write through operation, a buffer size reduction operation, or a performance throttling operation.

9. The method of claim 1, further comprising:
performing an operation at limited speed when the data transfer mode is the brown-out mode.

10. The method of claim 1, further comprising:
performing a nonvolatile memory buffering operation when the data transfer mode is the brown-out mode.

11. A storage device comprising:
a current limiter configured to receive an external voltage and to limit current;
at least one voltage regulator configured to receive the external voltage output from the current limiter, and to generate a first power supply voltage, a second power supply voltage, and a third power supply voltage;
a voltage sensor configured to sense the external voltage;
a NAND package configured to receive the first power supply voltage from the at least one voltage regulator, and including a plurality of NAND flash memory devices;
a volatile memory device configured to receive the second power supply voltage from the at least one voltage regulator; and
a controller configured to receive the third power supply voltage from the at least one voltage regulator and to control the NAND package and the volatile memory device, wherein:
the controller receives a voltage information signal from the voltage sensor, and selects a data transfer mode, the data transfer mode being selected as either a normal mode or a brown-out mode in response to the voltage information signal;
wherein the normal mode is selected when the external voltage exists within a normal range between a first operation voltage and a second operation voltage, and the brown-out mode is selected when the external voltage exists within a low power range below the normal range and between the second operation voltage and a power-off detection voltage;
wherein the first operation voltage is a maximum operation voltage of the normal range and the second operation voltage is a minimum operation voltage of the normal range;
wherein the storage device supports a nonvolatile memory device (NVM) buffer operation in both the normal mode and the brown-out mode; and
wherein an operation speed of the brown-out mode is different from an operation speed of the normal mode.

12. The storage device of claim 11, further comprising:
a power loss prevention circuit configured to monitor the external voltage and to signal the controller to perform a backup operation when the external voltage is cut off or drops below a reference value.

13. The storage device of claim 12, wherein:
the power loss prevention circuit transmits a power-off detection signal to the controller in a general purpose input/output (GPIO) interface manner.

14. The storage device of claim 11, further comprising:
a nonvolatile memory device configured to perform a buffering function.

15. The storage device of claim 14, wherein:
a first buffering operation is performed using the volatile memory device in the normal mode; and
a second buffering operation is performed using the nonvolatile memory device in the brown-out mode.

16. An operating method of a storage device, the method comprising:
monitoring an external voltage;
determining whether the external voltage is lower than a minimum operation voltage;
when the external voltage is lower than the minimum operation voltage, determining whether the external voltage is lower than a power-off detection voltage;
performing an input/output operation according to a first brown-out mode when the external voltage is lower than the minimum operation voltage and higher than the power-off detection voltage;
performing an input/output operation according to a normal mode when the external voltage is not lower than the minimum operation voltage; and
dumping a firmware when the external voltage is lower than the power-off detection voltage, wherein the input/output operation according to the first brown-out mode includes a write through operation supported in both the normal mode and the brown-out mode, and wherein an operation speed of the brown-out mode is different from an operation speed of the normal mode.

17. The method of claim 16, further comprising:
performing a power loss prevention function when the external voltage is cut off or drops below a reference value.

18. The method of claim 16, further comprising:
performing an input/output operation according to a second brown-out mode when the external voltage is higher than a maximum operation voltage.

19. The method of claim 16, further comprising:
performing an input/output operation according to the normal mode when the external voltage exists between the minimum operation voltage and a maximum operation voltage.

20. The method of claim 16, further comprising:
performing a charging operation of an auxiliary power supply included in the storage device according to a second brown-out mode when the external voltage is higher than a maximum operation voltage.

* * * * *